US006713357B1

(12) United States Patent
Wang et al.

(10) Patent No.: US 6,713,357 B1
(45) Date of Patent: Mar. 30, 2004

(54) METHOD TO REDUCE PARASITIC CAPACITANCE OF MOS TRANSISTORS

(75) Inventors: Hai Hong Wang, Fremont, CA (US); Mark W. Michael, Cedar Park, TX (US); Wen-Jie Qi, Austin, TX (US); William G. En, Milpitas, CA (US); John G. Pellerin, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 148 days.

(21) Appl. No.: 10/023,348

(22) Filed: Dec. 20, 2001

(51) Int. Cl.[7] .............................................. H01L 21/336
(52) U.S. Cl. ..................... 438/287; 438/230; 438/696
(58) Field of Search ................................ 438/287, 230, 438/595, 696

(56) References Cited

U.S. PATENT DOCUMENTS

| 5,476,803 | A | 12/1995 | Liu |
| 5,998,271 | A | 12/1999 | Schwalke |
| 6,238,987 | B1 | 5/2001 | Lee |
| 6,251,764 | B1 * | 6/2001 | Pradeep et al. ............. 438/595 |
| 6,406,945 | B1 * | 6/2002 | Lee et al. .................. 438/142 |

* cited by examiner

Primary Examiner—Van Thu Nguyen
Assistant Examiner—Brad Smith

(57) ABSTRACT

The present invention relates to a method for fabricating MOS transistors with reduced parasitic capacitance. The present invention is based upon recognition that the parasitic capacitance of MOS transistors, such as are utilized in the manufacture of CMOS and IC devices, can be reduced by use of sidewall spacers having an optimized cross-sectional shape, in conjunction with an overlying insulator layer comprised of a low-k dielectric material.

16 Claims, 3 Drawing Sheets

METHOD TO REDUCE PARASITIC CAPACITANCE OF MOS TRANSISTORS

FIELD OF THE INVENTION

The present invention relates to a method for fabricating MOS transistors with reduced parasitic capacitance, and to MOS transistors obtained thereby. The method has particular utility in the manufacture of high speed integrated circuit (IC) semiconductor devices.

BACKGROUND OF THE INVENTION

The escalating requirements for high integration density and performance associated with ultra-large scale ("ULSI") integration semiconductor devices are difficult to satisfy in terms of providing high circuit speeds. The circuit speed of such integrated circuit ("IC") devices varies inversely with the product of the resistance and capacitance, i.e., the "RC product" of the component transistors and the interconnection system. Thus, the greater the value of the RC product, the more limited the circuit speed. As a consequence of the RC effect, the rejection rate of IC devices due to circuit speed delays has become a limiting factor in IC fabrication.

According to current methodology for fabrication of IC devices utilizing multi-level metallization patterns, at least one dielectric layer, e.g., a gap-fill layer, is formed to cover the transistors and the surface of the semiconductor substrate in or on which the transistors, e.g., MOS transistors, are formed. However, a consequence of having a structure wherein multiple conductive layers are separated by a layer of a dielectric material is the formation of parasitic capacitances, e.g., between the conductive gates of the MOS transistors and the source/drain regions. The parasitic capacitance between the conductive materials, layers, or regions separated by insulating material, e.g., sidewall spacer and/or gap-fill materials, contributes to the RC product, hence time delay or operating speed, of microelectronic devices.

The capacitance of the parasitic capacitor between the gate electrode and source/drain regions of MOS transistors is related to the particular insulating materials present therebetween, typically the sidewall spacer and gap-fill dielectrics. A typical gap-fill dielectric material is silicon dioxide ($SiO_2$) and typical dielectric materials utilized for the spacers formed on opposite sidewalls of the gate electrode are $SiO_2$ and silicon nitride ($Si_3N_4$). However, the dielectric constants, k, for these materials are quite high, i.e., about 3.9 for $SiO_2$ and 7.0 for $Si_3N_4$. (For purposes of this disclosure, materials with k values above about 3.9 are considered as "high-k" materials and materials with k values below about 3.9 are considered as "low-k" materials). As a consequence of the presence of such high-k materials in the form of sidewall spacers and/or gap-fill, the parasitic capacitance between the gate electrodes and source/drain regions of MOS transistors and similar devices utilizing such dielectrics is significantly high and, conversely, the device operating speeds are lowered.

In view of the foregoing, there exists a need for methodology enabling the formation of microelectronic devices, e.g., MOS transistors and MOS transistor-based devices, such as CMOS devices, which enables a substantial and significant reduction in parasitic capacitance between the gate electrodes and source/drain regions of the MOS transistors, whereby the RC time delay is decreased and operating speeds of the devices are increased.

The present invention, wherein thin, L-shaped dielectric spacers are formed on respective opposing side surfaces of a gate electrode/gate oxide layer stack, and the resultant structure subsequently covered with a low-k dielectric material, e.g., a gap-fill material, effectively addresses and solves the problem of parasitic capacitance associated with high-k dielectric sidewall spacers of conventional configuration, while maintaining full capability with all other aspects of conventional techniques for automated manufacture of microelectronic devices such as IC devices. Further, the methodology provided by the present invention can be readily and easily implemented in cost-effective manner utilizing conventional layer deposition and removal techniques. Finally, the methodology afforded by the present invention enjoys diverse utility in the manufacture of numerous and various types of semiconductor devices and/or components.

DISCLOSURE OF THE INVENTION

An advantage of the present invention is an improved method for manufacturing a semiconductor device having reduced parasitic capacitance.

Another advantage of the present invention is a method for manufacturing an improved MOS transistor device having reduced parasitic capacitance.

Yet another advantage of the present invention is an improved semiconductor device having reduced parasitic capacitance.

Still another advantage of the present invention is an improved MOS transistor device having reduced parasitic capacitance.

Additional advantages and other features of the present invention will be set forth in the description which follows and in part will become apparent to those having ordinary skill in the art upon examination of the following or may be learned from the practice of the invention. The advantages of the present invention may be realized as particularly pointed out in the appended claims.

According to an aspect of the present invention, the foregoing and other advantages are obtained in part by a method of manufacturing a semiconductor device having reduced parasitic capacitance, comprising sequential steps of:

(a) providing a semiconductor substrate including a surface with at least one MOS transistor structure therein or thereon, including a spaced-apart pair of shallow depth source and drain regions and an electrically conductive gate electrode having first and second opposing side surfaces and a top surface;

(b) forming a thin, L-shaped sidewall spacer of a high dielectric constant (high-k) insulator material on each of the first and second opposing side surfaces of the gate electrode, each thin, L-shaped sidewall spacer having a vertical portion extending on a respective side surface of the gate electrode to the top surface of the gate electrode and a horizontal portion extending on the substrate surface for a selected distance; and (c) forming a layer of a low dielectric constant (low-k) insulator material over at least the vertical and horizontal portions of each of the thin, L-shaped sidewall spacers, whereby parasitic capacitance between the gate electrode and each of the source and drain regions is reduced.

In accordance with embodiments of the present invention, step (a) comprises providing a semiconductor substrate of first conductivity type, including:

(i) a thin gate insulator layer in overlying contact with at least a portion of the substrate surface;

(ii) an electrically conductive gate electrode in overlying contact with the thin gate insulator layer, the gate electrode comprising first and second opposing side surfaces- and a top surface;

(iii) a pair of spaced-apart, shallow-depth, lightly-doped source and drain regions, each of the source and drain regions extending in the substrate to just beneath a respective proximal edge of the gate electrode; and (iv) a thin conformal liner layer in overlying contact with the substrate surface and the first and second opposing side surfaces and top surface of the gate electrode.

According to certain embodiments of the present invention, step (a) comprises providing a silicon (Si) substrate; the thin gate insulator layer (i) comprises a silicon oxide layer or a nitride/oxide layer stack; the electrically conductive gate electrode (ii) comprises polysilicon; and the thin conformal liner layer (iv) comprises a silicon oxide.

In accordance with embodiments of the present invention, step (b) comprises forming the thin, L-shaped sidewall spacer on each of the first and second opposing side surfaces of the gate electrode by sequential steps of:

($b_1$) forming a relatively thin, conformal layer of the high-k insulator material extending over the substrate surface and the first and second opposing side surfaces and top surface of the gate electrode;

($b_2$) forming a relatively thick, conformal layer of an insulator material extending over the relatively thin, conformal layer of high-k insulator material;

($b_3$) selectively removing portions of the relatively thick, conformal layer of insulator material which overlie portions of the relatively thin layer of high k insulator material on the substrate surface and which overlie the top surface of the gate electrode, thereby forming a pair of insulative spacers each in contact with respective vertically and horizontally extending portions of the relatively thin layer of high-k insulator material;

($b_4$) selectively removing portions of the relatively thin layer of high-k insulator material which overlie the top surface of the gate electrode and which extend on the substrate surface past the insulative spacers; and ($b_5$) selectively removing the pair of insulative spacers.

According to particular embodiments of the present invention, step ($b_1$) comprises forming an about 100–200 Å thick layer of a high-k insulator material, e.g., selected from among silicon nitrides and silicon oxynitrides; and steps ($b_1$)–($b_5$) collectively comprise forming L-shaped sidewall spacers wherein the vertical portion thereof extends on a respective side surface of the gate electrode for about 1000–1500 Å and the horizontal portion thereof extends on the substrate surface for about 500–800 Å.

In accordance with embodiments of the present invention, step ($b_2$) comprises forming an about 800 to about 1,000 Å thick layer of a silicon oxide; step ($b_3$) comprises forming a pair of insulative spacers having a cross-sectional width tapering from wide adjacent said horizontally extending portion of the relatively thin layer of high-k insulator material on the substrate surface to narrow at the upper surface of the portion of the relatively thin layer of high-k insulator material on the top surface of the gate electrode.

According to embodiments of the present invention, step ($b_3$) comprises anisotropic etching, step ($b_4$) comprises isotropic etching, and step ($b_5$) comprises isotropic etching.

In accordance with certain embodiments of the present invention, step (b) further comprises selectively implanting a portion of each of the shallow depth, lightly-doped source and drain regions with ions subsequent to performing at least one of steps ($b_1$), ($b_3$), ($b_4$), and ($b_5$) to thereby form deeper, more heavily-doped source and drain regions; and step (c) comprises forming at least one layer of at least one low-k dielectric material selected from the group consisting of: hydrogen silsesquioxane ("HSQ"), poly(arylene) ethers, divinylsiloxane bis-benzocyclobutene ("BCB"), $FO_x$™, FLARE 2.0™, XLK™, SiLK™, carbon-doped silicon oxides, hybrid siloxane-organic polymers, nano-porous silica, halogen-doped silicon oxides derived from tetraethyl orthosilicate ("TEOS"), and fluorine-doped silicate glasses ("FSG").

Another aspect of the present invention is a semiconductor device, e.g., a MOS transistor device or a CMOS device, manufactured according to the foregoing method.

Yet another aspect of the present invention is an improved semiconductor device having reduced parasitic capacitance, comprising:

(a) a semiconductor substrate including a surface with at least one MOS transistor structure therein or thereon, including a spaced-apart pair of source and drain regions and an electrically conductive gate electrode having first and second opposing side surfaces and a top surface;

(b) a thin, L-shaped sidewall spacer of a high dielectric constant ("high-k") insulator material on each of the first and second opposing side surfaces of the gate electrode, each thin, L-shaped sidewall spacer having a vertical portion extending on a respective side surface of the gate electrode to the top surface of the gate electrode and a horizontal portion extending on the substrate surface for a selected distance; and (c) a layer of a low dielectric constant ("low-k") insulator material over at least the vertical and horizontal portions of each of the thin, L-shaped sidewall spacers, whereby parasitic capacitance between the gate electrode and each of the source and drain regions is reduced.

In accordance with embodiments of the present invention, the semiconductor substrate (a) is of a first conductivity type and includes:

(i) a thin gate insulator layer in overlying contact with at least a portion of the substrate surface;

(ii) an electrically conductive gate electrode in overlying contact with the thin gate insulator layer, the gate electrode comprising first and second opposing side surfaces and a top surface;

(iii) a pair of spaced-apart source and drain regions, each of the source and drain regions extending in the substrate to just beneath a respective proximal edge of the gate electrode; and (iv) a thin conformal liner layer in overlying contact with the substrate surface and the first and second opposing side surfaces and top surface of the gate electrode.

According to particular embodiments of the present invention, the thin gate insulator layer (i) comprises a silicon oxide layer or a nitride/oxide layer stack, the electrically conductive gate electrode (ii) comprises polysilicon, and the thin conformal liner layer (iv) comprises a silicon oxide; each of the thin, L-shaped sidewall spacers of a high-k insulator material on the first and second opposing side surfaces of the gate electrode comprises a silicon nitride or a silicon oxynitride; the vertical portions of the L-shaped sidewall spacers (b) extend on the first and second side surfaces of the gate electrode for about 1000–1500 Å and the horizontal portions of the L-shaped sidewall spacers extend on the substrate surface for about 500–800 Å; and the layer of a low-k dielectric material (c) comprises at least one layer of at least one material selected from the group consisting of: hydrogen silsesquioxane ("HSQ"), poly(arylene) ethers, divinylsiloxane bis-benzocyclobutene ("BCB"), FO$_x$™, FLARE 2.0™, XLK™, SiLK™, carbon-doped silicon oxides, hybrid siloxane-organic polymers, nano-porous silica, halogen-doped silicon oxides derived from tetraethyl orthosilicate ("TEOS"), and fluorine-doped silicate glasses ("FSG").

Additional advantages and aspects of the present invention will become apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the relevant features are not necessarily drawn to scale but rather are drawn as to best illustrate the pertinent features, and in which like reference numerals are employed throughout to designate similar features, wherein.

DESCRIPTION OF THE INVENTION

The present invention is based upon recognition that the parasitic capacitance of MOS transistors, such as are utilized in the manufacture of CMOS and IC devices, can be substantially and significantly reduced by use of sidewall spacers having an optimized cross-sectional shape, in conjunction with an overlying insulator layer comprised of a low-k dielectric material.

A key feature of the present invention, therefore, is the formation of a pair of thin, L-shaped sidewall spacers formed on respective side surfaces of a gate electrode/gate insulator layer stack forming part of a MOS transistor, with the resultant structure subsequently covered with a low-k dielectric material, e.g., a gap-fill material, which process effectively addresses and solves the problem of parasitic capacitance associated with high-k dielectric sidewall spacers of conventional configuration, while maintaining full capability with all other aspects of conventional techniques for automated manufacture of microelectronic devices such as IC devices. Further, the methodology provided by the present invention can be readily and easily implemented in cost-effective manner utilizing conventional layer deposition and removal techniques. Finally, the methodology afforded by the present invention enjoys diverse utility in the manufacture of numerous and various types of semiconductor devices and/or components.

An embodiment of the present invention will now be described with reference to FIGS. 1(A)–1(G) which illustrate, in simplified, cross-sectional, schematic form, sequential steps in performing a process for manufacturing a reduced parasitic capacitance MOS transistor according to the invention.

The term "semiconductor substrate" as employed throughout the present disclosure and claims, denotes a Si-containing wafer, e.g., a monocrystalline Si wafer, or an epitaxial Si-containing layer formed on a semiconductor substrate comprising at least one region 1 of a first conductivity type. It will be appreciated that for P-MOS transistors, region 1 is n-type and for N-MOS transistors, region 1 is p-type. It is further understood that the substrate may comprise pluralities of n- and p-type regions arrayed in a desired pattern, as, for example, in CMOS devices.

Figure 1A:
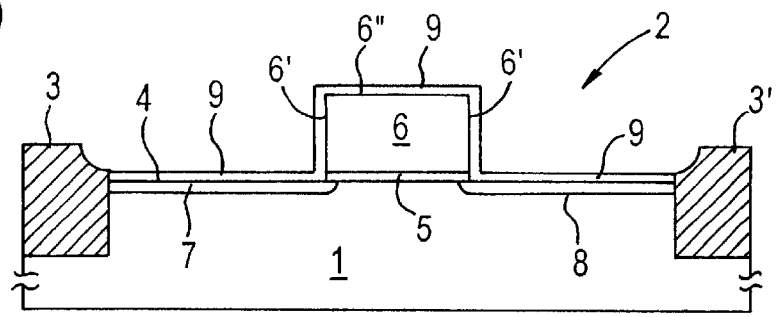
FIGS. 1(A)–1(G) illustrate, in simplified, cross-sectional, schematic form, sequential steps in performing a process for manufacturing a reduced parasitic capacitance MOS transistor according to the present invention.

Referring more particularly to FIG. 1(A), as indicated above, reference numeral 1 indicates a region or portion of a Si-containing semiconductor substrate of a first conductivity type (p or n), fabricated as a MOS transistor precursor 2. Precursor 2 is processed, as by conventional techniques not described here in detail, in order to not unnecessarily obscure the primary significance of the following description, and comprises a plurality of, illustratively two, isolation regions 3 and 3' of a silicon oxide, e.g., shallow trench isolation (STI) regions, extending from the substrate surface 4 to a prescribed depth below the surface. A gate insulator layer segment 5, typically comprising a silicon oxide layer or a nitride/oxide stacked layer about 10–20Å thick, is formed on a portion of substrate surface 4. Electrically conductive gate electrode 6, typically of heavily-doped polysilicon, is formed over silicon oxide gate insulator layer segment 5 to a suitable thickness, e.g., about 1,000–1,500 Å, and comprises opposing side surfaces 6', 6', and top surface 6". A pair of lightly-doped, shallow-depth, source and drain regions 7, 8 formed by ion implantation extend within substrate portion 1 from just beneath respective side edges 6', 6' of gate electrode 6 to isolation regions 3 and 3'. A thin conformal layer of an insulative material, typically an about 20–40 Å thick liner oxide layer 9 of a thermal oxide of silicon, is formed to cover all exposed portions of the substrate surface 4 and the exposed surfaces of the various features formed thereon or therein, including, inter alia, the opposing side surfaces 6', 6' and top surface 6" of gate electrode 6.

Figure 1B:
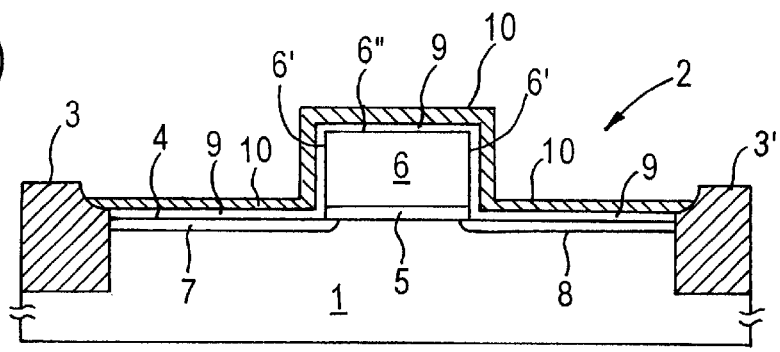

Referring now to FIG. 1(B), a thin, conformal layer 10 of a high-k dielectric spacer material (i.e., with k >3.9), such as a silicon nitride ($Si_xN_y$) or a silicon oxynitride ($Si_xO_yN_z$), is deposited over all exposed surfaces of the thin liner oxide layer 9, as by chemical vapor deposition (CVD) or plasma-enhanced chemical vapor deposition (PECVD). By way of illustration, according to an embodiment of the present invention, silicon nitride thin spacer layer 10 is formed with a thickness of about 100–200 Å.

Figure 1C:
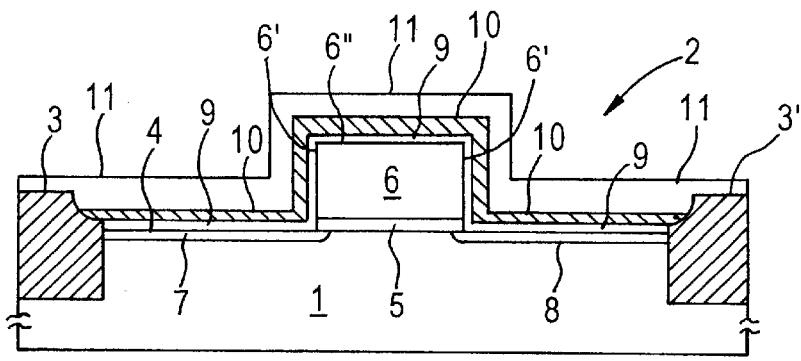

Adverting to FIG. 1(C), in a next step according to the inventive methodology, a relatively thick, conformal blanket layer 11 of another high-k insulator material having etch selectivity with respect to the high-k dielectric material of thin spacer layer 10, e.g., a silicon oxide, is formed to cover all exposed surfaces of thin spacer layer 10. The thickness of blanket insulative layer 11 is selected so as to provide, in a subsequent step, sidewall spacers 12, 12 of desired height, width, and tapered cross-sectional profile on each of the opposing side surfaces 6', 6' of the gate electrode 6. By way of illustration, according to an embodiment of the present invention, blanket insulative layer 11 is formed to a thickness of about 800–1,000 Å.

Figure 1D:
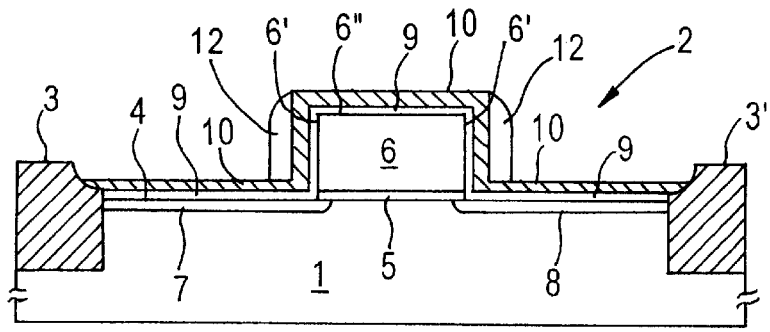

Referring to FIG. 1(D), blanket insulative layer 11 is then subjected to a selective anisotropic etching process, typically plasma etching in a halogen-containing atmosphere to remove portions thereof which overlie thin spacer layer 10 covering the top surface 6" of the gate electrode 6 and which overlie the horizontally extending portions of thin spacer layer 10 overlying the source and drain regions 7, 8. As a result, a pair of sidewall spacers 12, 12 each in contact with respective vertically and horizontally extending portions of thin spacer layer 10 are formed, having a cross-sectional width tapering from wide adjacent the horizontally extending portion of the thin spacer layer 10 to narrow at the upper surface of the portion of the thin spacer layer 10 on the top surface 6" of gate electrode 6.

Figure 1E:
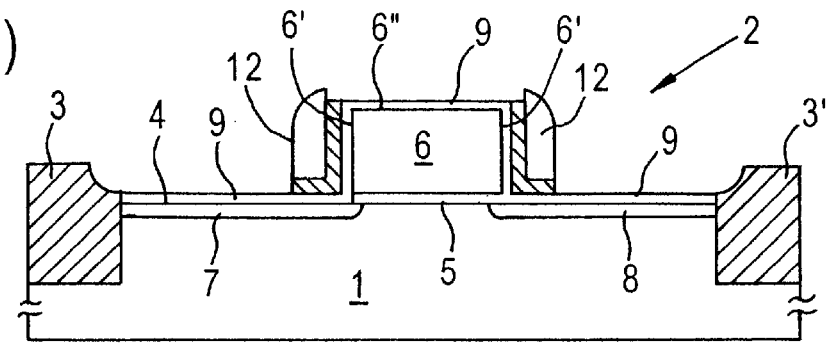

With reference to FIG. 1(E), in a next step according to the invention, a process for selectively removing exposed portions of the thin spacer layer 10 is performed, e.g., isotropic etching of a $Si_xN_y$ spacer layer 10 with hot phosphoric acid ($H_3PO_4$), i.e., the exposed portions of thin spacer layer 10 overlying the top surface 6" of gate electrode 6 and source and drain regions 7, 8, utilizing the silicon oxide-based sidewall spacers 12, 12 as an etch mask.

Figure 1F:
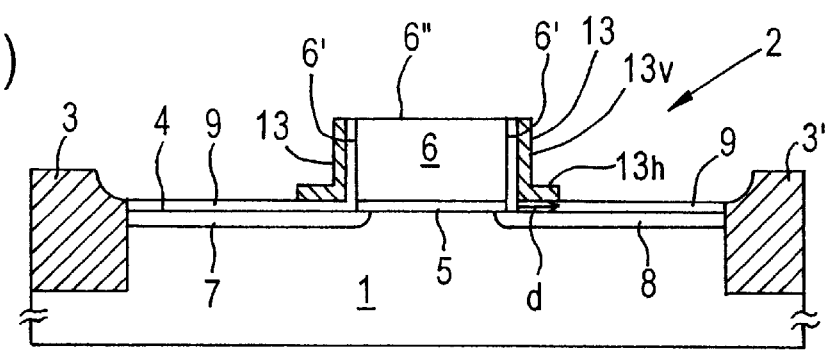

Adverting to FIG. 1(F), according to the next step of the invention, the tapered sidewall spacers 12, 12 of silicon oxide and the exposed portion of thin liner oxide layer 9 on the top surface 6" of gate electrode layer 6 are selectively removed, as by an isotropic etching process utilizing hydrofluoric acid (HF) or ammonium fluoride/hydrofluoric acid ($NH_4/HF$), to form the illustrated structure comprising a pair of relatively thin, L-shaped insulative sidewall spacers 13, 13, wherein each thin, L-shaped sidewall spacer 13, 13 has a vertical portion $13_v$ extending on a respective side surface 6', 6' of the gate electrode 6 to the top surface 6" thereof and a horizontal portion $13_h$ extending on substrate surface 4 for a selected distance d.

By way of illustration, according to an embodiment of the present invention, the vertical portions $13_v$ extend for about 1,000–1,500 Å along the respective side surfaces 6', 6' of the gate electrode 6 to the top surface 6" thereof, the horizontal portion $13_h$ extends on substrate surface 4 for a distance d of about 500–800 Å, and the thickness of each of the horizontal and vertical portions $13_h$ and $13_v$, respectively, corresponds to the as deposited thickness of the thin spacer layer 10, i.e., about 100–200 Å.

Figure 1G:
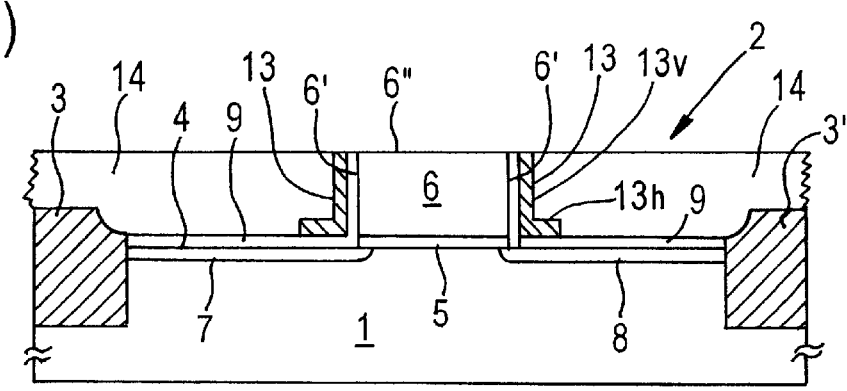

It should be noted that an ion implantation step may, if desired, be performed after completion of one or more of the process stages shown in FIGS. 1(B), (D), (E), and (F) in order to form deeper, more heavily-doped source and drain regions 7, 8 having a desired dopant concentration profile. Referring now to FIG. 1(G), a layer 14 of a low-k insulator material, e.g., a gap-fill layer, is formed over at least the vertical and horizontal portions $13_v$ and $13_h$ of each of the thin, L-shaped sidewall spacers 13, whereby parasitic capacitance between said gate electrode and each of said source and drain regions is reduced by interposition of the low-k dielectric material in the space between the source and drain regions 7, 8 and the respective side surfaces 6', 6' of the gate electrode 6. Layer 14 of low-k insulator material has a dielectric constant below about 3.9 and comprises at least one layer of at least one low-k dielectric material selected from the group consisting of: hydrogen silsesquioxane ("HSQ"), poly(arylene) ethers, divinylsiloxane bis-benzocyclobutene ("BCB"), $FO_x$™, FLARE 2.0™, XLK™, SILK™, carbon-doped silicon oxides, hybrid siloxane-organic polymers, nano-porous silica, halogen-doped silicon oxides derived from tetraethyl orthosilicate ("TEOS"), and fluorine-doped silicate glasses ("FSG").

Further processing of the structure illustrated in FIG. 1(G) for contact formation, metallization, encapsulation etc., may then be performed in conventional manner.

Figure 2:
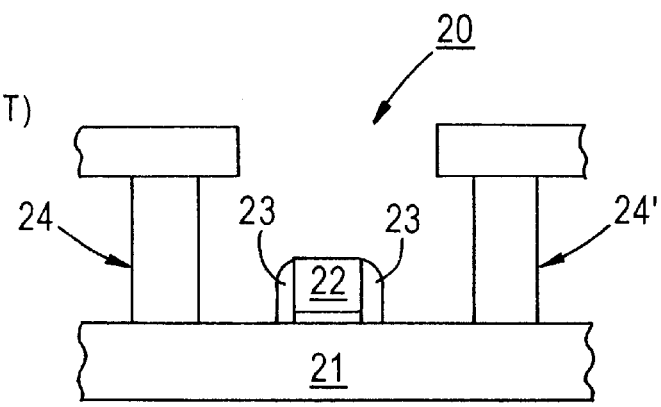
FIG. 2 illustrates, in simplified, cross-sectional view, a portion of a MOS transistor fabricated on a strained SOI substrate according to conventional practices.
Figure 3:
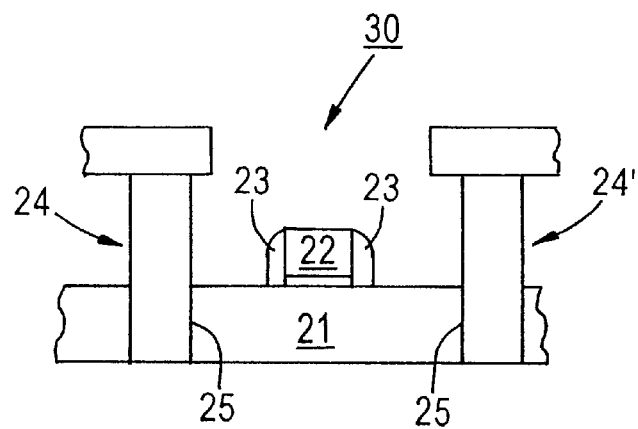
FIGS. 3 and 4, respectively, illustrate simplified cross-sectional and plan views of a MOS transistor fabricated on a strained SOI substrate according to the invention.
Figure 4:
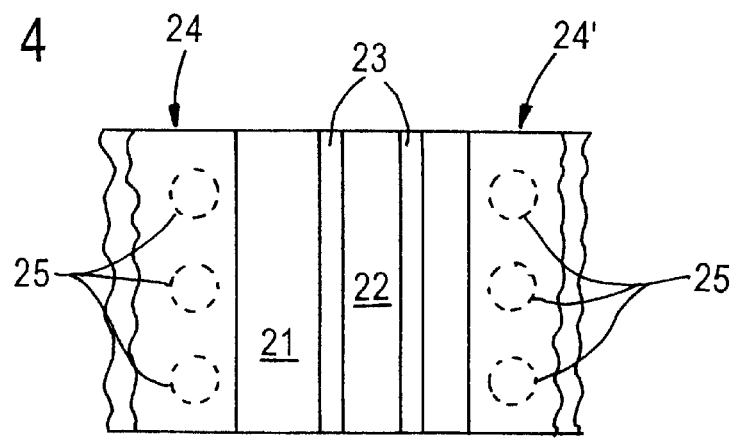

Referring now to FIGS. 2–4, the present invention may be practiced with Semiconductor-On-Insulator ("SOI")-type substrates utilizing strained silicon semiconductor layers. An example of a MOS transistor 20 fabricated on a strained SOI substrate according to conventional practices for contact formation is shown in simplified, schematic cross-sectional view in FIG. 2. As illustrated, transistor 20 comprises a SOI substrate 21 including a layer of strained Si, a polysilicon gate electrode 22 with a pair of insulative sidewall spacers 23, 23 formed on opposite side edges thereof and a pair of tungsten (W)/metal contact structures 24, 24' formed on the surface of substrate 21. However, a drawback associated with such structures is degradation of transistor performance arising from the use of the strained Si layers.

FIGS. 3–4 respectively illustrate, in simplified, schematic cross-sectional and plan views, an embodiment of a MOS transistor 30 fabricated according to the invention, in which stress in the Si layer of the SOI substrate 21 is relieved/relaxed by forming a plurality of openings 25 extending through the SOI substrate 21, and forming the pair of tungsten (W)/metal contact structures 24, 24' as to fill each of the openings 25. Electrical contact between the tungsten (W)/metal contact structures 24, 24' and the substrate 21 is made via the sidewalls of each of the openings 25.

Thus, the present invention facilitates formation of high quality MOS transistors and CMOS devices having high circuit speeds by providing a significant and substantial reduction in parasitic capacitance between the gate electrodes and source/drain regions of such devices. Advantageously, the inventive methodology can be practiced in cost-effective manner at rates consistent with the throughput requirements of automated manufacturing process flow for the manufacture of semiconductor IC devices and/or components thereof.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of manufacturing a semiconductor device having reduced parasitic capacitance, comprising sequential steps of:
   (a) providing a semiconductor substrate including a surface with at least one MOS transistor structure therein or thereon, including a spaced-apart pair of shallow depth source and drain regions and an electrically conductive gate electrode having first and second opposing side surfaces and a top surface;
   (b) forming a thin, L-shaped sidewall spacer of a high dielectric constant (high-k) insulator material on each of said first and second opposing side surfaces of said gate electrode, each said thin, L-shaped sidewall spacer having a vertical portion extending for about 1,000–1,500 Å along e a respective side surface of said gate electrode to said top surface of said gate electrode and a horizontal portion extending on said substrate surface for a distance of about 500–800Å; and (c) forming a layer of a low dielectric constant (low-k) insulator material over at least said vertical and horizontal portions of each of said thin, L-shaped sidewall spacers, whereby parasitic capacitance between said gate electrode and each of said source and drain regions is reduced.

2. The method as in claim 1, wherein:

step (a) comprises providing a semiconductor substrate of first conductivity type, including:
- (i) a thin gate insulator layer in overlying contact with at least a portion of said substrate surface;
- (ii) an electrically conductive gate electrode in overlying contact with said thin gate insulator layer, said gate electrode comprising first and second opposing side surfaces and a top surface;
- (iii) a pair of spaced-apart, shallow-depth, lightly-doped source and drain regions, each of said source and drain regions extending in said substrate to just beneath a respective proximal edge of said gate electrode; and
- (iv) a thin conformal liner layer in overlying contact with said substrate surface and said first and second opposing side surfaces and said top surface of said gate electrode.

3. The method as in claim 2, wherein:

step (a) comprises providing a silicon (Si) substrate;

said thin gate insulator layer (i) comprises a silicon oxide layer or a nitride/oxide layer stack;

said electrically conductive gate electrode (ii) comprises polysilicon; and said thin conformal liner layer (iv) comprises a silicon oxide.

4. A semiconductor device comprising at least one MOS transistor, manufactured according to the method of claim 1.

5. A method of manufacturing a semiconductor device having reduced parasitic capacitance, comprising sequential steps of:
- (a) providing a semiconductor substrate of a first conductivity type having a surface with at least one MOS transistor structure therein or thereon, including:
  - (i) a thin gate insulator layer in overlying contact with at least a portion of said substrate surface;
  - (ii) an electrically conductive gate electrode in overlying contact with said thin gate insulator layer, said gate electrode comprising first and second opposing side surfaces and a top surface;
  - (iii) a pair of spaced-apart, shallow-depth, lightly-doped source and drain regions, each of said source and drain regions extending in said substrate to just beneath a respective proximal edge of said gate electrode; and
  - (iv) a thin conformal liner layer in overlying contact with said substrate surface and said first and second opposing side surfaces and said top surface of said gate electrode;
- (b) forming a thin, L-shaped sidewall spacer of a high dielectric constant (high-k) insulator material on each of said first and second opposing side surfaces of said gate electrode by sequential steps of:
  - ($b_1$) forming a relatively thin, conformal layer of said high-k insulator material extending over said substrate surface and said first and second opposing side surfaces and said top surface of said gate electrode;
  - ($b_2$) forming a relatively thick, conformal layer of an insulator material extending over said relatively thin, conformal layer of said high-k insulator material;
  - ($b_3$) selectively removing portions of said relatively thick, conformal layer of insulator material which overlie portions of said relatively thin layer of high k insulator material on said substrate surface and which overlie said top surface of said gate electrode, thereby forming a pair of insulative spacers each in contact with respective vertically and horizontally extending portions of said relatively thin layer of high-k insulator material;
  - ($b_4$) selectively removing portions of said relatively thin layer of high-k insulator material which overlie said top surface of said gate electrode and which extend on said substrate surface past said insulative spacers; and
  - ($b_5$) selectively removing said pair of insulative spacers, each said thin. L-shaped sidewall spacer having a vertical portion extending on a respective side surface of said gate electrode to said top surface of said gate electrode and a horizontal portion extending on said substrate surface for a selected distance; and
- (c) forming a layer of a low dielectric constant (low-k) insulator material over at least said vertical and horizontal portions of each of said thin, L-shaped sidewall spacers, whereby parasitic capacitance between said gate electrode and each of said source and drain regions is reduced.

6. The method as in claim 5, wherein:

step ($b_1$) comprises forming an about 100–200 Å thick layer of a high-k insulator material.

7. The method as in claim 6, wherein:

step (b) comprises forming L-shaped sidewall spacers wherein said vertical portion extends on a respective side surface of said gate electrode for about 1000–1500 Å and said horizontal portion extends on said substrate surface for about 500–800 Å.

8. The method as in claim 6, wherein:

step ($b_1$) comprises forming a layer of a high-k dielectric material selected from silicon nitrides and silicon oxynitrides.

9. The method as in claim 5, wherein:

step ($b_2$) comprises forming an about 800 to about 1,000 Å thick layer of a silicon oxide.

10. The method as in claim 5, wherein:

step ($b_3$) comprises forming a pair of insulative spacers having a cross-sectional width tapering from wide adjacent said horizontally extending portion of said relatively thin layer of high-k insulator material on said substrate surface to narrow at the upper surface of the portion of said relatively thin layer of high-k insulator material on said top surface of said gate electrode.

11. The method as in claim 10, wherein:

step ($b_3$) comprises anisotropic etching.

12. The method as in claim 5, wherein:

step ($b_4$) comprises isotropic etching.

13. The method as in claim 5, wherein:

step ($b_5$) comprises isotropic etching.

14. The method as in claim 5, wherein:

step (b) further comprises selectively implanting a portion of each of said shallow depth, lightly-doped source and drain regions with ions subsequent to performing at least one of steps ($b_1$), ($b_3$), ($b_4$), and ($b_5$) to thereby form deeper, more heavily-doped source and drain regions.

15. The method as in claim 5, wherein:
step (c) comprises forming at least one layer of at least one low-k dielectric material selected from the group consisting of: hydrogen silsesquioxane ("HSQ"), poly (arylene) ethers, divinylsiloxane bis-benzocyclobutene ("BCB"), $FO_x$™, FLARE 2.0™, XLK™, SiLK™, carbon-doped silicon oxides, hybrid siloxane-organic polymers, nano-porous silica, halogen-doped silicon oxides derived from tetraethyl orthosilicate ("TEOS"), and fluorine-doped silicate glasses ("FSG").

16. A semiconductor device comprising at least one MOS transistor, manufactured according to the method of claim 5.

* * * * *